United States Patent
Yamazaki (10) Patent No.: US 6,574,258 B2
(45) Date of Patent: Jun. 3, 2003

(54) SEMICONDUCTOR LASER HAVING AN ACTIVE LAYER PROVIDED BETWEEN TWO DIFFERENT CONDUCTION TYPES OF SEMICONDUCTOR LAYERS, AND OPTICAL MODULES AND COMMUNICATION SYSTEMS FORMED THEREWITH

(75) Inventor: Hiroyuki Yamazaki, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 113 days.

(21) Appl. No.: 09/770,115

(22) Filed: Jan. 23, 2001

(65) Prior Publication Data

US 2001/0012306 A1 Aug. 9, 2001

(30) Foreign Application Priority Data

Jan. 24, 2000 (JP) ........................................ 2000-014707

(51) Int. Cl.$^7$ .............................. H01L 33/00; H01S 5/00
(52) U.S. Cl. ............................ 372/46; 372/45; 257/101; 257/103
(58) Field of Search ................................ 257/101, 102, 257/103; 372/43, 45, 46

(56) References Cited

U.S. PATENT DOCUMENTS 6,498,076 B1 * 12/2002 Koui ............................ 438/479

FOREIGN PATENT DOCUMENTS

JP 08-330676 12/1996 ............. H01S/3/18

OTHER PUBLICATIONS

Kato, T., et al, "DFB–LD/Modulator Integrated light source by bandgap energy controlled selective MOVPE" Electronic Letters vol. 28, No. 2, Jan. 16, 1992.

Ishikawa H., et al, "Origin of n–type conduction at the interface between epitaxial–grown layer and InP substrate and its suppression by heating in phosphine atmosphere", J. Appl. Pyys. 71 (8), Apr. 15, 1992.

* cited by examiner

*Primary Examiner*—Minh Loan Tran
(74) *Attorney, Agent, or Firm*—Hayes Soloway P.C.

(57) ABSTRACT

A semiconductor laser, optical module using a semiconductor laser, and optical communication system using a semiconductor laser. The semiconductor laser has an active layer between two semiconductor layers and different conduction types and current block layers surrounding the active layer. One of the semiconductor layers has a first growth layer and a second growth layer formed on the first growth layer by a re-growth process after a growth process for the first growth layer. The doping concentration of the first growth layer, in the region of the interface with the second growth layer, is in the range of between 1.5 to 5 times the doping concentration of the second growth layer.

10 Claims, 10 Drawing Sheets

DISTRIBUTION FEEDBACK
SEMICONDUCTOR LASER
PORTION 300μm

OSCILLATOR
PORTION 200μm

SEMICONDUCTOR LASER HAVING AN ACTIVE LAYER PROVIDED BETWEEN TWO DIFFERENT CONDUCTION TYPES OF SEMICONDUCTOR LAYERS, AND OPTICAL MODULES AND COMMUNICATION SYSTEMS FORMED THEREWITH

BACKGROUND OF THE INVENTION

1. Field of the Invention

The present invention relates to a semiconductor laser, a semiconductor optical integrated device, an optical module and an optical communication system.

2. Description of the Related Art

A buried type semiconductor laser is widely used as a light source for optical communications in the wavelength band of 1.3 to 1.55 μm (micrometer) because it can be highly efficiently coupled to a single-mode optical fiber and also it has an excellent oscillating characteristic. Particularly, from the viewpoint of reducing driving current, semiconductor lasers have been strongly required to perform a high slope efficiency operation.

In order to perform the high slope efficiency operation in the semiconductor lasers, it is necessary to reduce the leak current and the absorption loss. With respect to the leak current, a pnpn thyristor or high-resistance semiconductor is used as a current block layer to implement an excellent oscillation characteristic. Particularly, the current narrowing structure based on the pnpn thyristor is widely used because this structure can be relatively easily established by merely changing dopant and also it has a high withstand voltage characteristic. On the other hand, with respect to the absorption loss, a low-loss waveguide is implemented by introducing a distorted quantum well structure. That is, the band structure of the valence band is varied by introducing in-plane compressive distortion into the well layer having the quantum well structure, whereby absorption in the long wavelength band can be greatly reduced.

When these semiconductor lasers are manufactured, MOVPE (Metal Organic Vapor Phase Epitaxy) is most frequently used for crystal growth. This is because in-plane uniformity of crystal quality and reproducibility are excellent and a high-quality multiple quantum well (MQW) layer can be grown.

Owning to the crystal growth technique, the introduction of the quantum well/distorted quantum well structure into an active layer (active region) and a buried structure having an excellent current narrowing structure, the oscillation characteristics of the semiconductor lasers have been greatly improved. At present, a high-performance semiconductor laser having a threshold current of several mA (milliampere) is practically used.

However, in the process of manufacturing the semiconductor lasers, MOVPE growth is required to be carried out at plural times, and there is such a fear that high-concentration Si deposited on the re-growth interface affects the oscillation characteristic. The high-concentration Si is estimated to occur at the re-growth interface as follows. That is, Si components which exist in the air or contaminated into echant are deposited on the surface of the semiconductor and then taken into crystals at the re-growth time.

An estimated oscillating characteristic when high-concentration Si is doped into the re-growth interface will be described with reference to FIG. 1.

A normal buried type semiconductor laser is manufactured by carrying out the crystal growth operation at three times. Therefore, it has two re-growth interfaces, and Si concentration at these portions is increased. Re-growth interface 31 and re-growth interface 32 in FIG. 1 correspond to these portions. However, the re-growth interfaces which come into contact with an n-InP current block layer and an n-InP substrate little affect the oscillation characteristic and the electric characteristic because the same donor doping is carried out. At the re-growth interface 31 shown by a solid line of FIG. 1, particularly at the portion just above an active layer, a high-concentration donor doping layer is inserted into a p-layer to increase the resistance of this portion, so that the leak current is remarkably increased. The leak current serves as the base current of the current block layer to reduce the withstand voltage of the block layer, resulting in reduction in optical output. On the other hand, with respect to the re-growth interface 32 shown by a broken line of FIG. 1, there is no problem at the portion of the re-growth interface 32 which comes into contact with the n-InP substrate, however, the portions of the re-growth interface 32 which come into contact with the side wall of the active layer and the p-InP layer greatly affect the oscillation/electric characteristics. This is because if an Si pileup layer having low electric resistance exists along the side wall, leak current flows along the side wall and thus the slope efficiency is lowered.

As described above, the Si concentration of the re-growth interface and the oscillation characteristic of the semiconductor laser are in close relation with each other. Therefore, in order to enhance the oscillation characteristic, a layer whose conduction type has been inverted to n-type is required to be re-inverted to p-type by some method to remove the high-resistance layer and the leak current leaking path.

SUMMARY OF THE INVENTION

An object of the present invention is to provide a novel semiconductor laser and a method of manufacturing the semiconductor laser in which a portion whose conduction type has been inverted to n-type due to Si pileup at the re-growth interface thereof is re-inverted to p-type to enhance the oscillation characteristic. Another object of the present invention is to provide a cheap optical module and an optical communication system by using the semiconductor laser.

In order to attain the above objects, according to a first aspect of the present invention, there is provided a semiconductor laser comprising an active layer (active region) provided between two different conduction types of semiconductor layers and current block layers surrounding the active layer, wherein one of the semiconductor layers has a first growth layer and a second growth layer which is formed on the first growth layer by a re-growth process after a growth process for the first growth layer, and the doping concentration of the first growth layer in the range of at least 0.1 μm in thickness from the interface between the first growth layer and the second growth layer is in the range from 1.5 times to 5 times of the doping concentration of the second growth layer. The active layer (active region) is a layer (region) which a luminous transition to contribute to the laser operation is generated.

According to a second aspect of the present invention, there is provided an optical module formed by using at least one semiconductor laser of the present invention.

According to a third aspect of the present invention, there is provided an optical communication system formed by using at least one semiconductor laser of the present invention.

According to the present invention, Si deposited at the re-growth interface is taken in crystals as donor dopant in the re-growth process. In the following description, the effect on the oscillation characteristic when donor dopant exists at the re-growth interface will be quantitatively reviewed.

Figure 2:
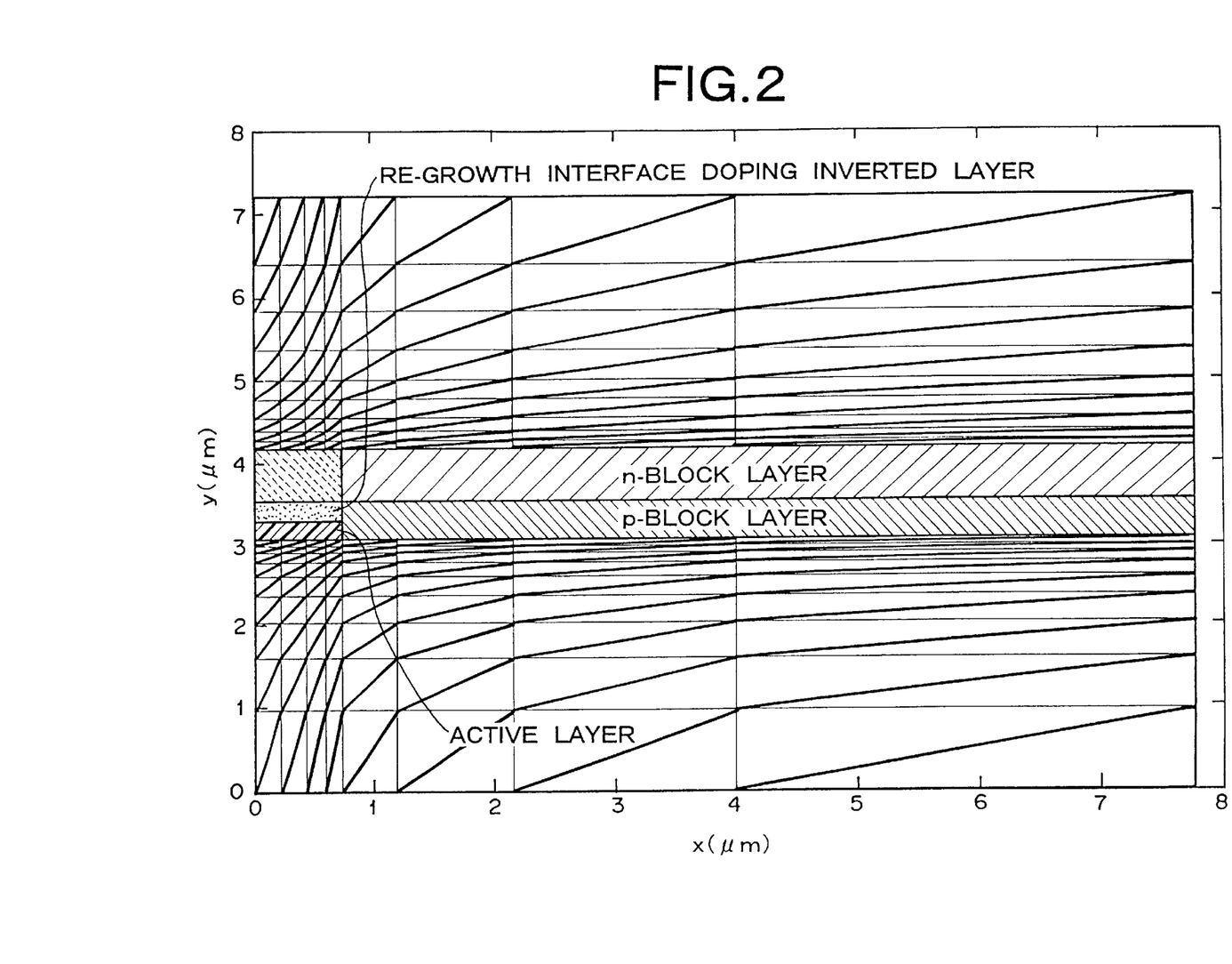
FIG. 2 shows a mesh pattern used for oscillation characteristic analysis.
Figure 3:
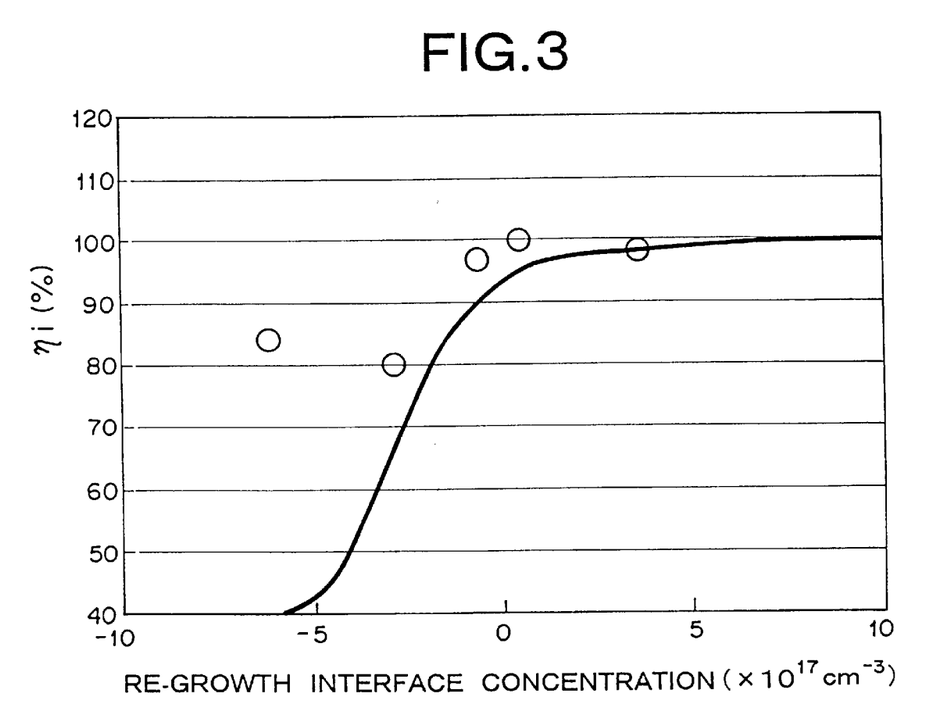
FIG. 3 shows a calculation result of an internal differential quantum efficiency.

A commercially available LD simulator was used to analyze the oscillation characteristic. In this LD simulator, a current continuous equation, a Poisson equation and a rate equation are solved self-consistently. FIG. 2 shows a mesh pattern used for the analysis. The mesh interval is made minute at the active layer having strong non-linearity and the peripheral portion of the pn junction in order to prevent the solution precision from being degraded. FIG. 3 shows the dependence of the internal differential quantum efficiency $\eta i$ on the re-growth interface concentration.

Figure 1:
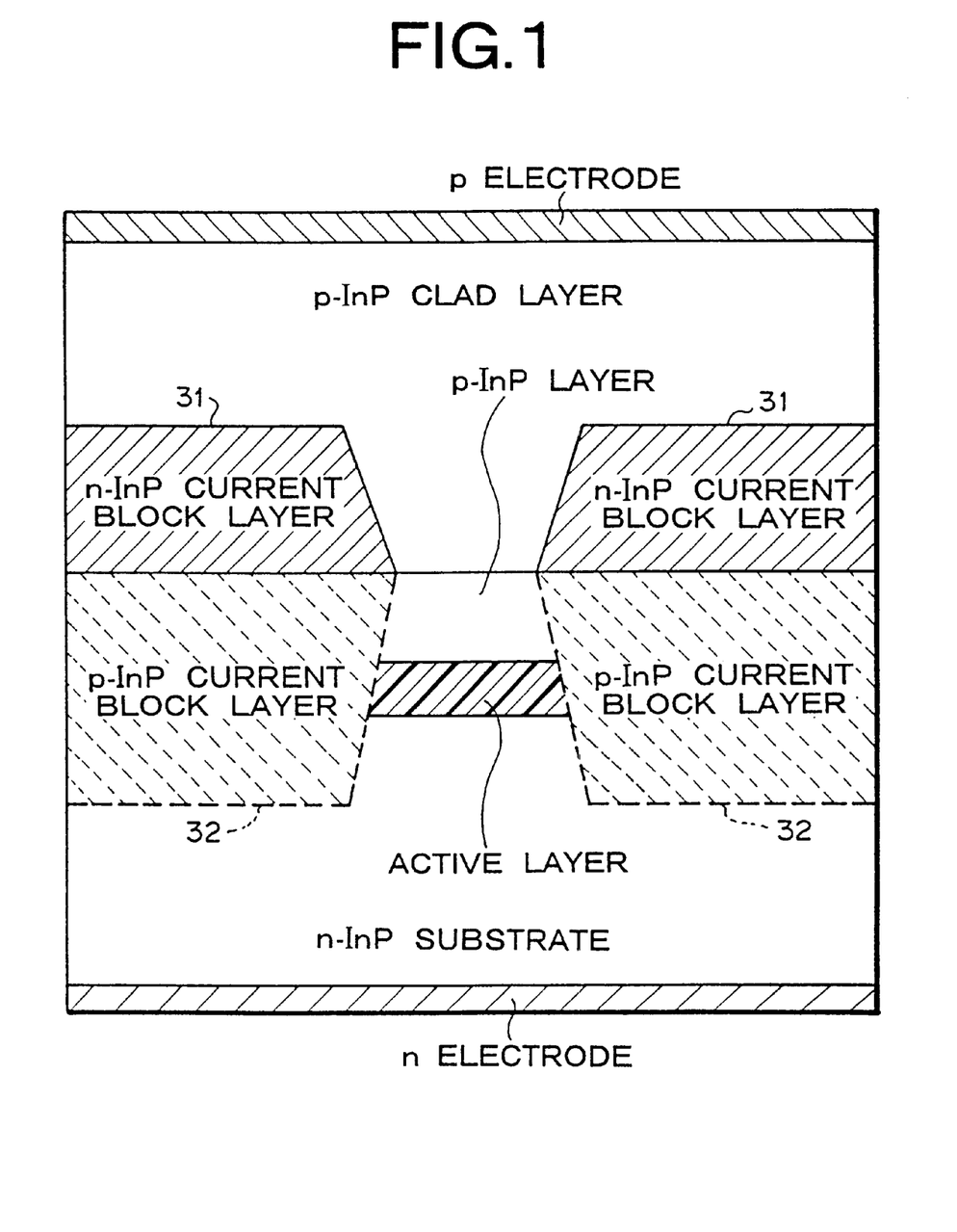
FIG. 1 is a diagram showing the structure of a conventional semiconductor laser.

In this analysis, the oscillation characteristic was analyzed while the concentration of the re-growth interface 31 of FIG. 1 just above the active layer was varied from p-type to n-type. Further, since the thickness over which the concentration variation occurs at the re-growth interface is proved to be equal to about 0.1 $\mu m$ from the SIMS (Secondary Ion Mass Spectroscopy) analysis, the calculation was made by using this fact. In the FIG. 3, circles represent the measurement result of the internal differential quantum efficiency $\eta i$ calculated on the basis of the dependence of the slope efficiency on the length of a resonator, and the solid line represents the calculation result. Both the measurement and calculation results are very coincidence with each other. If the re-growth interface is p-type, the effect on the oscillation characteristic is little. On the other hand, if the re-growth interface is n-type, the internal differential quantum efficiency is lowered, so that the slope efficiency trends to be reduced. If an n-type layer is formed just above the active layer in the p clad layer, the resistance of the n-type layer portion is increased and thus injection of holes into the active layer is disturbed. The holes thus disturbed flows as base current into a p current block layer to thereby increase leak current passing through the current block layer, so that the oscillation characteristic is expected to have remarkable optical output saturation.

As a method of reducing the Si concentration at the re-growth interface, in the case of GaAs type semiconductor, a long-term standby state is kept while a large amount of $AsH_3$ flows. A leading theory to explain this effect is that H+ radicals contained in $AsH_3$ removes Si adhering to the surface. However, this method is unfavorable because In contained in crystals are removed in the re-growth standby state of InP containing no As and further InAsP having short wavelength composition is formed at the re-growth interface. There is such a report that the Si concentration at the re-growth interface can be reduced by high-temperature/long-time standby under flow of $PH_3$ in the growth standby of InP (H. Ishikawa, et al., Journal of Applied Physics, Vol. 71, p.3898, 1992). However, according to this method, the standby temperature is set to a high value (700° C.) and thus crystallinity at the re-growth interface may be lowered.

According to the present invention, the Si concentration at the re-growth interface can be effectively lowered to achieve a semiconductor laser having an excellent oscillation characteristic without passing through a special pre-growth standby step in the re-growth process which has been hitherto carried out. Specifically, high-concentration Zn is doped into a portion which has been inverted to n-type (this portion will be hereinafter referred to as "inverted n-type portion (area)") due to high-concentration Si adhering to the re-growth interface, thereby inverting the conduction type of this portion from n-type to p-type (this p-type portion will be hereinafter referred to as "inverted p-type portion"). It has been found from the SIMS analysis that the thickness of the area whose conduction type is inverted to n-type in the neighborhood of the re-growth interface is not more than 0.1 $\mu m$ (0.1 $\mu m$ or less). Therefore, by doping high-concentration Zn into an area of 0.1 $\mu m$ (more suitably on manufacture process 0.2 $\mu m$) in thickness (larger than the thickness of the above n-type area), the n-typed high-resistance layer is inverted to a p-type layer, thereby enabling holes to be effectively injected into the active layer, so that there can be achieved a semiconductor laser having an excellent characteristic which can oscillate with a high slope efficiency.

DETAILED DESCRIPTION OF THE PREFERRED EMBODIMENTS

Preferred embodiments according to the present invention will be described with reference to the accompanying drawings.

(First Embodiment)

A manufacturing method according to a first embodiment of the present invention will be described along a manufacturing process shown in FIGS. 4A to 4C, 5A and 5B.

Figure 4A:
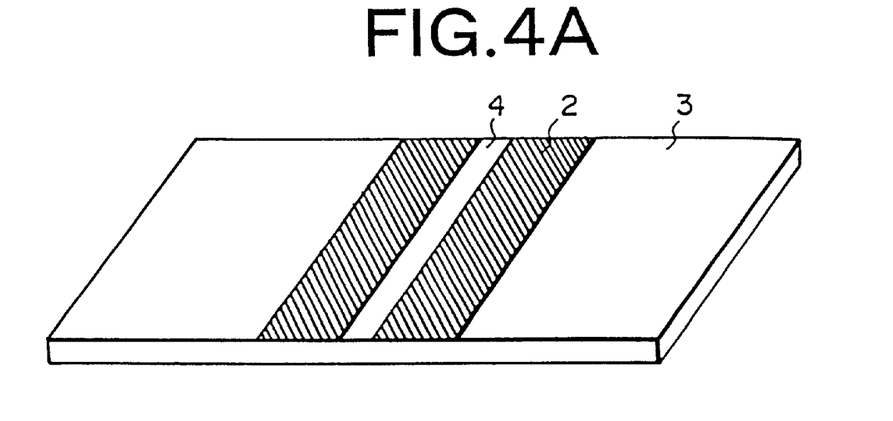
FIGS. 4A to 4C are diagrams showing a manufacturing process of the semiconductor laser according to the present invention.
Figure 6:
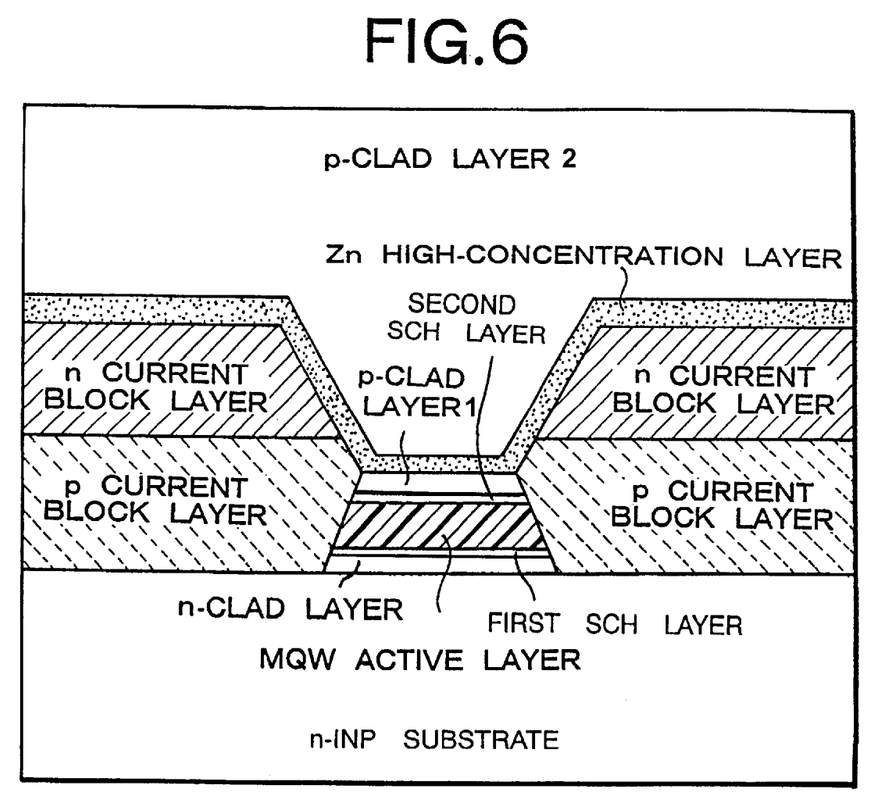
FIG. 6 is a diagram showing the structure of a semiconductor laser according to an embodiment of the present invention.

Growth preventing film 2 formed of $SiO_2$ film having a thickness of 100 nm (nanometer) was deposited on the (001) plane of n-InP substrate 3 by a thermal CVD (Chemical vapor deposition) method. Subsequently, a resist pattern used of selective MOVPE was formed by a photolithography process. The growth preventing film 2 was etched with diluted hydrofluoric acid to complete a substrate used in a growth step. This state is shown in FIG. 4A. The width of each growth preventing film 2 was set to 5 $\mu m$ (micrometer), and the width of the interval portion 4 between the confronting growth preventing films was set to 1.5 $\mu m$. As best shown in FIG. 6, a n-InP clad layer of 100 nm, a first SCH (separated confinement hetero structure) layer of InGaAsP having 1.1 $\mu m$ wavelength composition of 50 nm, an MQW (multiple quantum well) layer (that is, an active layer), a second SCH layer of InGaAsP having 1.1 μm wavelength composition of 50 nm and a p-InP clad layer (that is a first growth layer designated "p-Clad Layer 1" in FIG. 6) of 100 nm were successively epitaxially grown by the selective MOVPE.

Figure 4B:
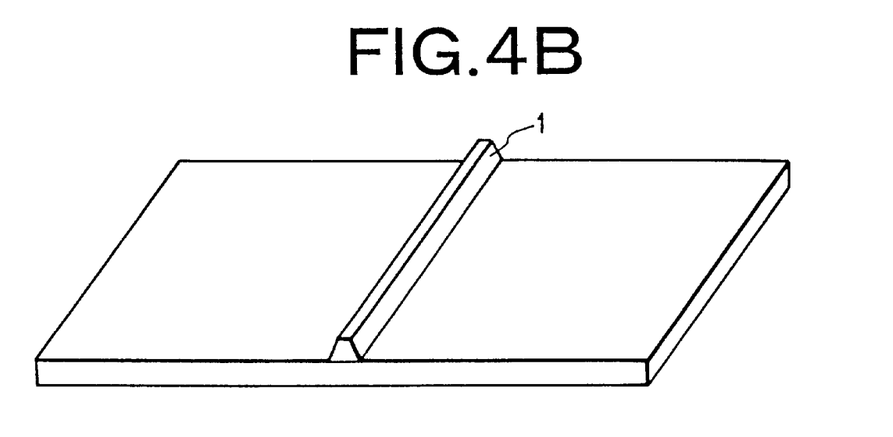
Figure 4C:
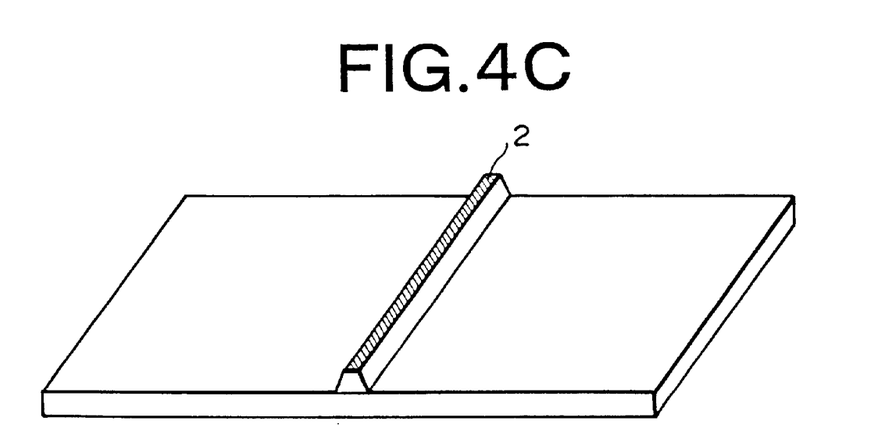
Figure 5A:
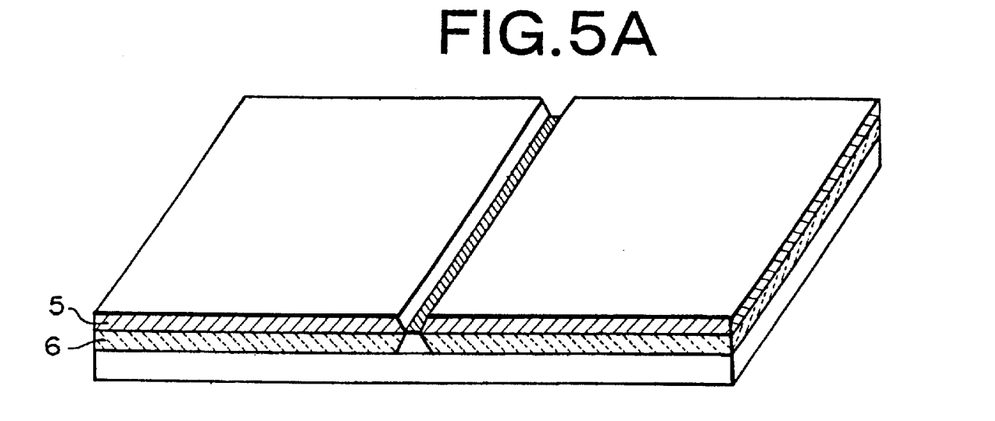
FIGS. 5A and 5B are diagrams showing a subsequent manufacturing process of FIGS. 4A to 4C.

The MQW layer 1 was composed of well layers of InGaAsP having 1.4 μm wavelength composition and a barrier layer of InGaAsP having 1.1 μm wavelength composition sandwiched between the well layers. The MQW layer 1 was designed so that the period is equal to 7, the thickness of the well layers was equal to 7 nm, the thickness of the barrier layer was equal to 10 nm and the oscillation wavelength was equal to 1.3 μm. The crystals in these layers were not grown on the growth preventing films 2, and selectively grown on the n-InP substrate 3 of the interval portion 4. After a waveguide having the MQW layer 1 was selectively grown, the growth preventing films 2 of $SiO_2$ were removed with hydrofluoric acid. This state is shown in FIG. 4B. A growth preventing film of $SiO_2$ was deposited on the whole surface again. Thereafter, the self-align process was carried out so that the growth preventing film 2 was formed only on the top of the waveguide thus directly formed and the other growth preventing films were removed with hydrofluoric acid. This state is shown in FIG. 4C. The MOVPE growth was conducted attain by using this growth preventing film 2 as a mask to successively form p-InP current block layer 6 of 0.7 μm and n-InP current block layer 5 of 0.7 μm. This state is shown in FIG. 5A. Subsequently, the growth preventing film 2 was removed and then p-InP clad layer 8 (that is, a second growth layer designated "Zn high-concentration layer" and "p-Clad Layer 2" in FIG. 6) was formed. When the p-InP clad layer 8 was grown, Zn of $2 \times 10^{18}$ cm$^{-3}$ was doped into an area having a thickness of 0.2 μm from the re-growth interface in order to prevent occurrence of an inverted n-type area in the p-InP clad layer 8 due to Si deposited just above the active layer, and then Zn of $1 \times 10^{18}$ cm$^{-3}$ was doped into a subsequent area to grow the p-InP clad layer 8 at 3 μm. Current can be more effectively injected into the active layer as the Zn concentration in the neighborhood of the re-growth interface is increased. However, when the Zn concentration is excessively high, there is such a fear that the absorption loss is increased and thus the oscillation characteristic may be degraded. Further, there is also such a fear that Zn diffusion into the active layer in the neighborhood of the re-growth interface and thus degradation in oscillation characteristic may occur. Therefore, it has been experimentally found that the upper limit of the Zn concentration is set to about five times of the Zn concentration at the other portions (the second growth layer). On the other hand, when the Zn concentration is below 1.5 times, a desired slope efficiency is not obtained.

Figure 5B:
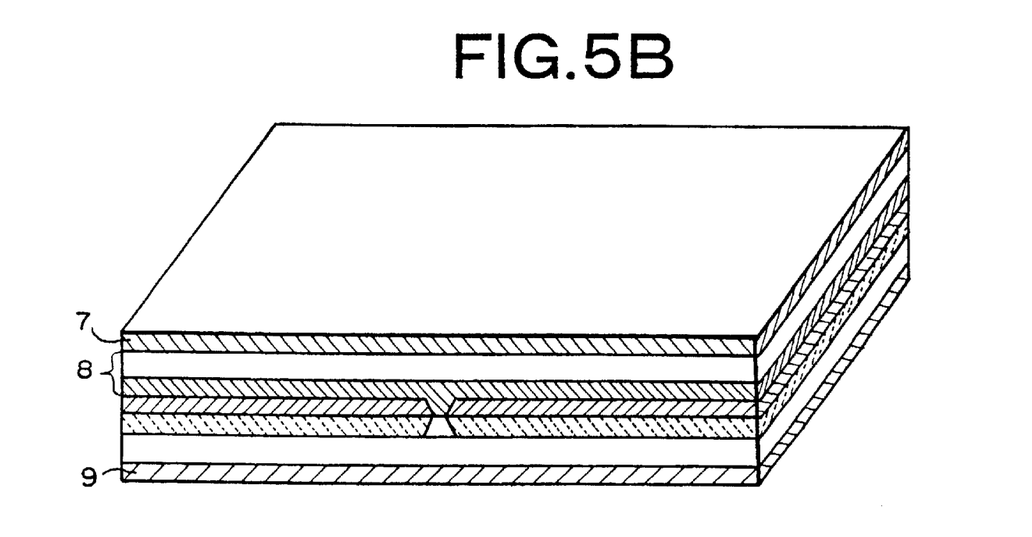

FIG. 6 is a cross-sectional view showing the p-doping profile of the semiconductor device of the present invention. The Zn concentration of the Zn high-concentration layer in FIG. 6 is set to about two times of the Zn concentration of an area other than the Zn high-concentration layer in the p-InP clad layer 8. P-electrode 7 and n-electrode 9 of TiAu were formed on both the surfaces of the semiconductor device, and then an electrode alloy was carried out at 430° C. to complete the device. This state is shown in FIG. 5B.

The device thus obtained was cut out to set the length thereof to 300 μm, and 95% coating was conducted on the rear end surface thereof to estimate the oscillation characteristic. An excellent oscillation characteristic was achieved like the following results: the threshold current of 2.5 mA (milliampere) and the slope efficiency of 0.55 W/A (watts/ampere) at room temperature, and the threshold current of 10 mA and the slope efficiency of 0.45 W/A at 85° C. The internal differential quantum efficiency estimated on the basis of the dependence of the slope efficiency on the resonator length reaches 100% of the theoretical upper limit value, and the internal absorption loss reaches a low value (10 cm$^{-1}$) although the device of the present invention has a relatively strong light confinement structure.

(Second Embodiment)

Figure 7:
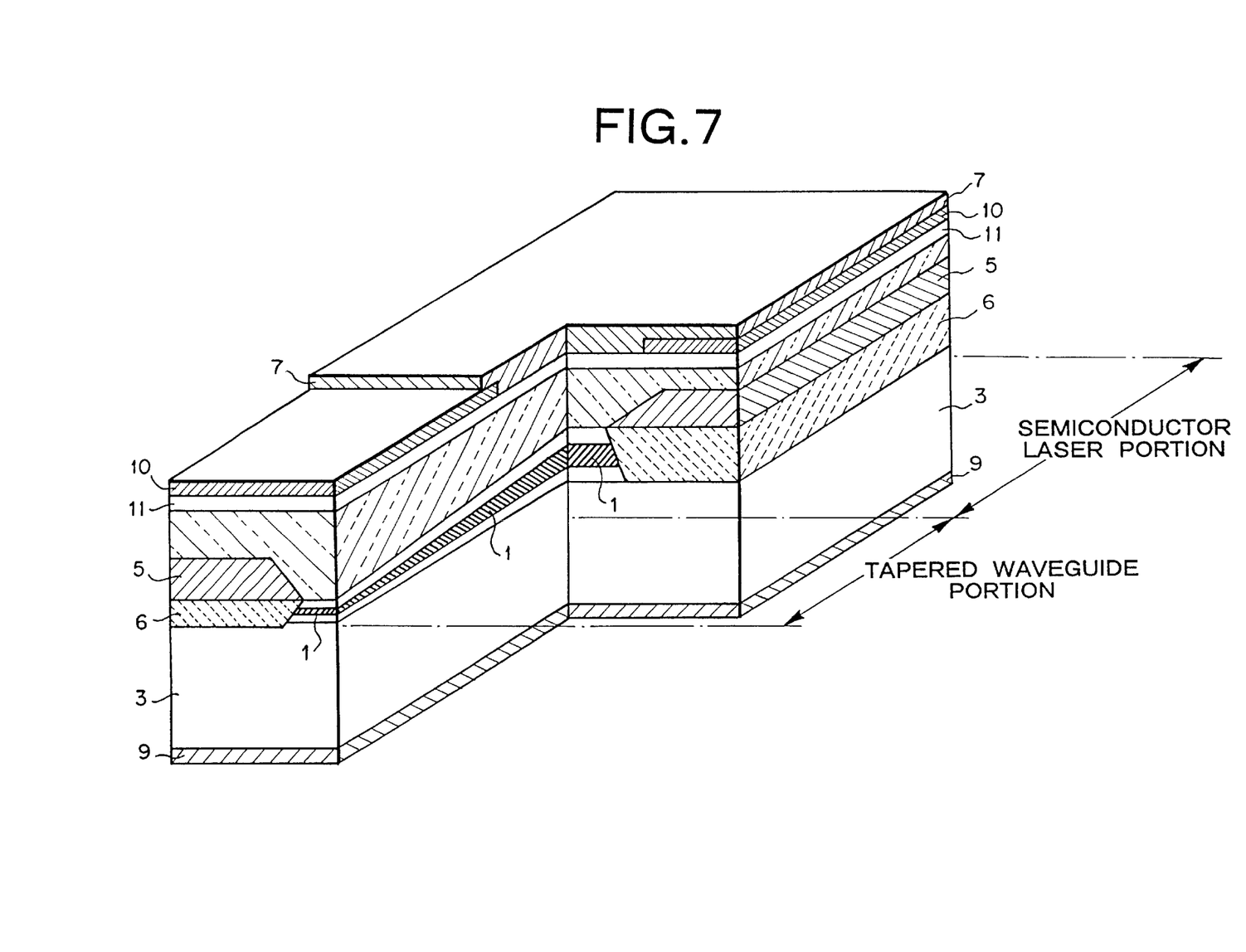
FIG. 7 is a diagram showing the structure of SSC-LD.

Next, an embodiment when a device (SSC-LD) in which a tapered waveguide which is varied in waveguide thickness is integrated in the same resonator is manufactured will be described. FIG. 7 shows the structure of the device.

Figure 8:
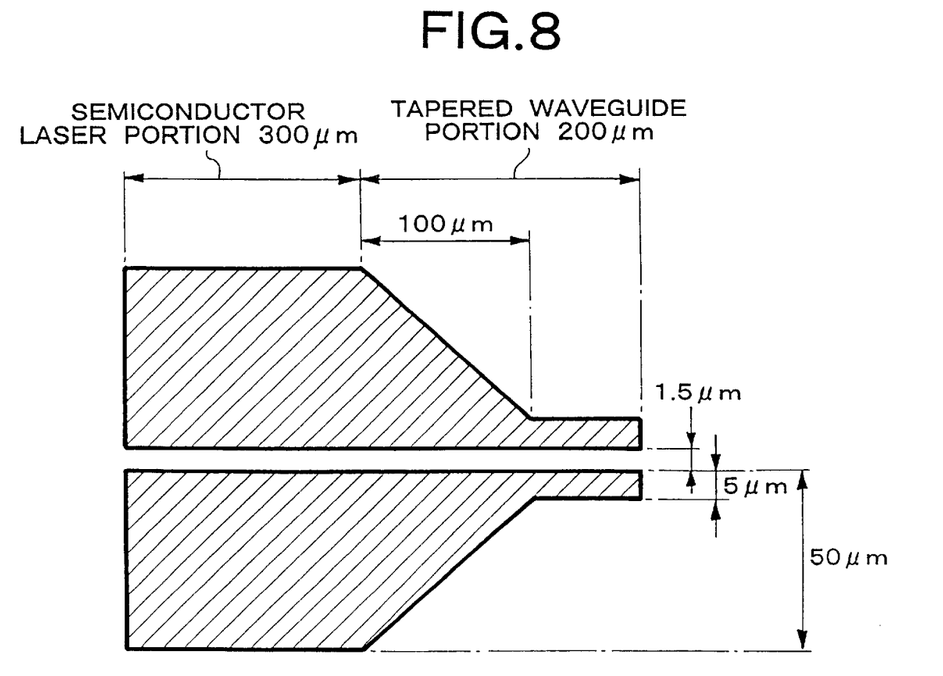
FIG. 8 shows a growth preventing film pattern of SSC-LD.

The manufacturing process was substantially the same as the first embodiment, and the difference between the first and second embodiments resided in that a tapered waveguide portion which was gradually reduced in thickness toward the light emission end and a semiconductor laser portion were collectively formed. Oxide film 10 and p cap layer 11 is formed under p-electrode 7. MPQ active layer 1 and a tapered waveguide layer were collectively formed at the interval portion of an oxide film mask by the selective MOVPE. FIG. 8 shows a pattern of a growth preventing film 2 by using selective growth. The length of the semiconductor laser portion was equal to 300 μm, and the length of the tapered waveguide portion was equal to 200 μm. The width of the growth preventing film at the semiconductor laser portion was equal to 50 μm, and the width of the growth preventing film at the tapered waveguide portion was set to be narrowed from 50 μm to 5 μm toward the light emission end. A tapered structure in which the growth rate of the interval portion is reduced and the thickness of the waveguide is reduced toward the light emission end can be formed by using such a pattern that the width of the growth preventing film 2 is narrowed toward the light emission end. Since the side surface of the tapered waveguide was (111) crystal plane, a waveguide having a low scattering loss could be obtained. After the MQW layer 1 serving as the active layer and the tapered waveguide layer are collectively formed, SSC-LD can be manufactured by the same device manufacturing process as the first embodiment. The p-electrode 7 was formed over the light emission portion and on a part of the tapered waveguide to carry out current injection into a part of the tapered waveguide, thereby preventing increase of the absorption loss.

As a result, there can be achieved a characteristic having a lower threshold value which was equal to 4 mA, 12 mA at 25° C., 85° C. respectively. Further, the driving current under 85° C.-10 mW (milliwatts) was low (40 mA), and thus it is expected to achieve an optical module to which temperature control is not required. The integration of the tapered waveguide narrowed the radiation angle from 33° (horizontal radiation angle), 35° (vertical radiation angle) of the normal semiconductor laser to 10° (horizontal radiation angle and vertical radiation angle). In addition, it exhibited an excellent coupling characteristic with a single mode fiber having a spot size diameter of 10 μm, for example, the minimum coupling loss with the single mode fiber was equal to 1.5 dB (decibel).

(Third Embodiment)

Next, a method of manufacturing a device in which a distribution feedback type semiconductor laser having a diffraction grating and an electric field absorption type modulator are integrated (EML; Electroabsorption Modulator Integrated Laser) will be described. EML is disclosed in the report ("DFB-LD/MODULATOR INTEGRATED LIGHT SOURCE BY BANDGAP ENERGY CON- TROLLED SELECTIVE MOVPE" Electronics Letters 16th January 1992, Vol.28, No.2).

Figure 9:
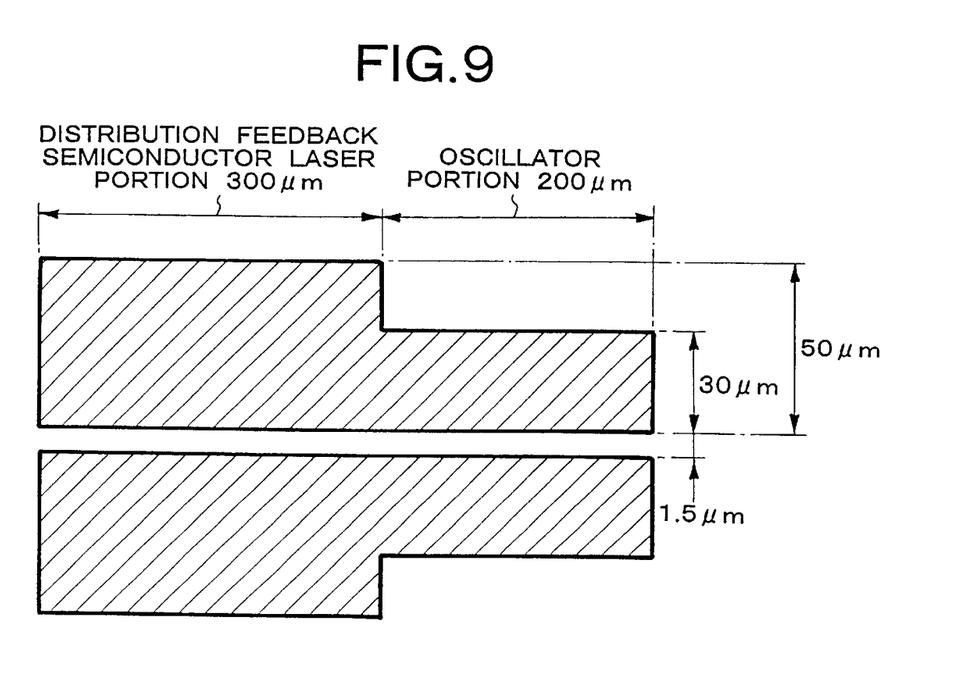
FIG. 9 shows a growth preventing film pattern of DFB/MOD.

The large difference between this embodiment and the first embodiment resides in the pattern of the growth preventing film 2 used for the selective MOVPE. FIG. 9 shows a mask pattern used to collectively form the MQP active layer 1 and an absorption layer. The resonator length of the distribution feedback semiconductor laser portion was set to 300 µm and the length of the modulator portion was set to 200 µm. The growth preventing film width was fixed to 50 µm at the distribution feedback semiconductor laser portion and 30 µm at the modulator portion. The MQP active layer 1 and the absorption layer were collectively formed at the interval portion having a width of 1.5 µm by the selective MOVPE. The wavelength shift due to the variation of the growth preventing film width was equal to 70 nm, and the device was designed so that the wavelength shift amount suitable as the electric field absorption type modulator was obtained. After the selective MOVPE, EML could be manufactured by the same device manufacturing process as the first embodiment. However, electrically independent electrodes were formed on the distribution feedback type semiconductor laser portion and the modulator portion. Further, an Fe-doped InP high-resistant layer was used as the current block layer.

EML manufactured by this embodiment was oscillated with threshold current of 3 mA. The extinction ratio when 2 V was applied to the absorption layer was equal to 20 dB, which was an excellent value. Further, an excellent clear eye opening was obtained even under 2.5 Gb (gigabite) modulation. When a normal fiber transmission experiment of 600 km (kilometer) was conducted by using the same integrated device, a small value of 0.5 dB was obtained as power penalty.

(Fourth Embodiment)

Figure 10:
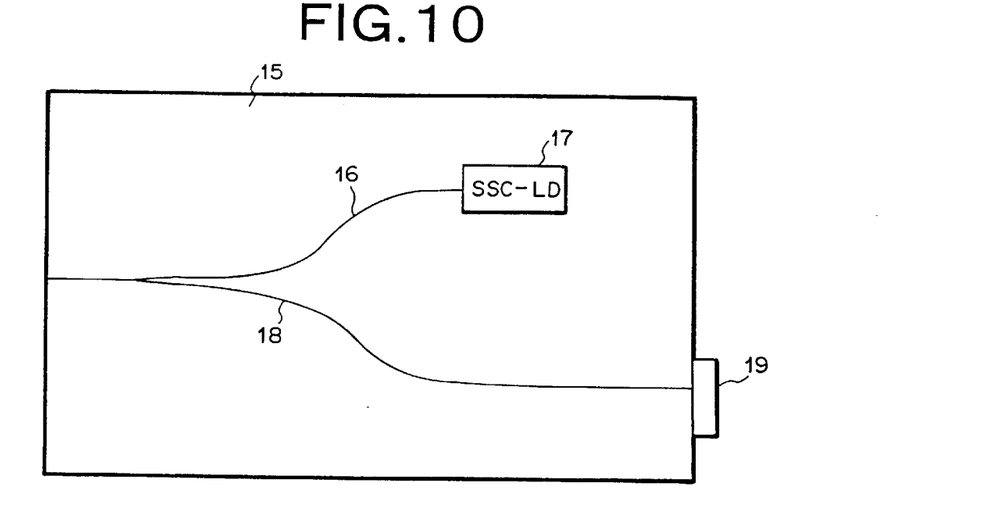
FIG. 10 is a diagram showing the structure of an optical module according to the present invention.

FIG. 10 is a diagram showing an optical module in which SSC-LD 17 is mounted on PLC (planar lightwave circuit) substrate 15 in passive-alignment. The passive-alignment mounting is a technique of arranging the device on the PLC substrate 15 by matching an electrode pattern secured to the device with the pattern of the PLC substrate through image recognition to couple the device and the waveguide to each other without carrying out the optical axis adjustment which has been hitherto carried out. Much attention is paid to this method because it can greatly reduce the mounting cost. Y-branched waveguide 18 is formed on the PLC substrate 15. SSC-LD 17 is mounted on one branch of the Y-branched waveguide 18, and a photodetecting element 19 is mounted on the other branch. The coupling loss between the waveguide 16 of the PLC substrate 15 and the SSC-LD 17 was equal to 4 dB, and the excessive loss due to the passive-alignment mounting was suppressed to a small value (1.3 dB).

The semiconductor laser of the present invention is greatly improved in oscillation characteristic, and also improved in high-temperature operating characteristic. Therefore, the temperature control which has been hitherto carried out for the conventional semiconductor laser is not needed. Accordingly, the optical module can be constructed at a very low price.

(Fifth Embodiment)

Figure 11:
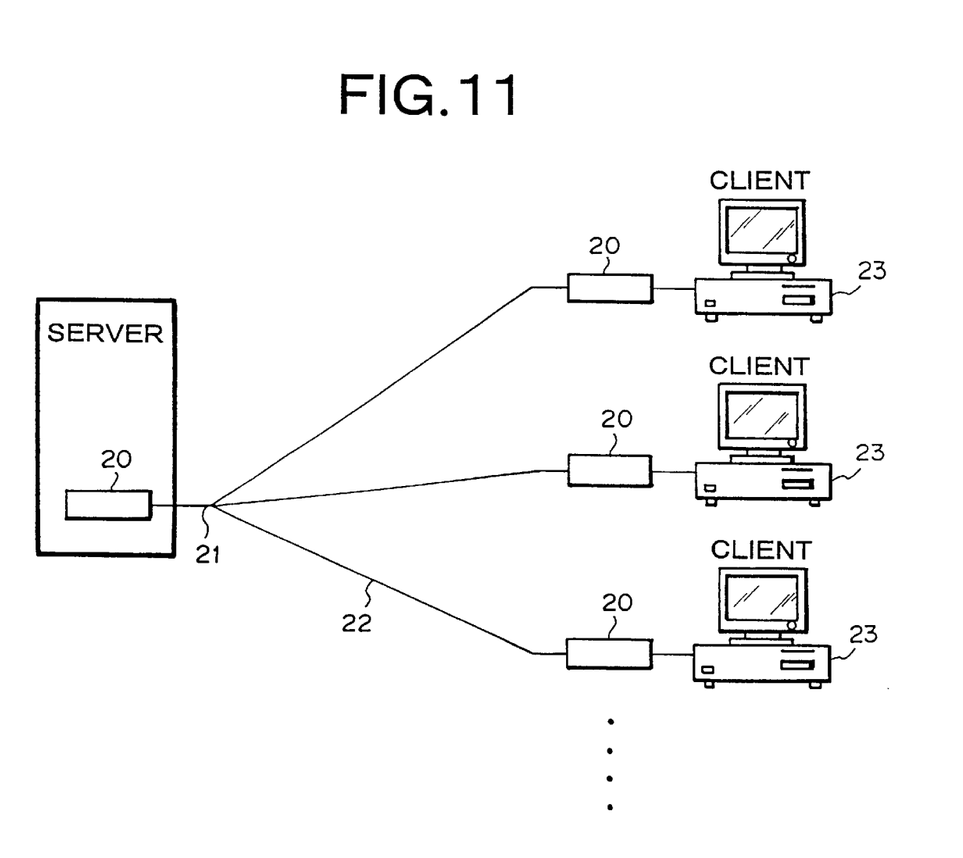
FIG. 11 is a diagram showing the construction of an optical communication system according to the present invention.

FIG. 11 shows the construction of an optical communication system to which the optical module of the fourth embodiment is applied.

In this optical communication system, optical module 20 of a server and personal computer 23 a client are connected to each other by one optical fiber 22 through 8- to 32-branched star coupler 21. The cheap optical module 20 can be implemented by the present invention, and thus a communication system such as LAN or the like can be implemented at low cost.

(Sixth Embodiment)

In the first embodiment, the MQW layer was formed by the selective MOVPE growth. In addition to the structure of the first embodiment, the present invention can effectively applied to such a normal structure that a waveguide is formed through a wet etching or dry etching treatment by using SiO$_2$ as a mask, which is normally carried out. In this case, a light emission portion comprising a MQW layer or bulk layer was first formed on an n-InP substrate by crystal growth. Subsequently, in order to form a waveguide, a stripe of 1.5 µm in width was formed of SiO$_2$ on the substrate, and then etching was conducted to form the waveguide. Thereafter, by using SiO$_2$ as a mask again, a p current block layer and an n current block layer were successively grown by the MOVPE growth, and a p-InP clad layer was grown on the whole surface of the substrate after SiO$_2$ was removed. The workpiece thus obtained was passed through a normal electrode process to complete the device. Further, when the current block layer and the p-InP clad layer are formed, the device can be manufactured by using LPE (Liquid Phase Epitaxy) in place of MOVPE. When the device was estimated by using the same resonator length and the same end face structure as the first embodiment, substantially the same oscillation character could be achieved.

(Other Embodiments)

The present invention may be applied to a DBR (distributed Bragg reflector) laser structure in which a black waveguide having a semiconductor laser portion and a diffraction grating formed therein is integrated, and a distribution feedback semiconductor laser structure in which a diffraction grating is formed in a semiconductor laser portion. Further, in the above-described embodiments, MQW is formed of InGaAsP/InP type materials, however, it may be formed of AlGaAs/GaAs type materials, AlGaInP/GaInP type materials, ZnSe type or other compound semiconductor materials. At least one of a taper waveguide, an optical modulator, a photodetector, an optical switch and an optical waveguide may be integrally formed with the semiconductor laser of the present invention.

According to the present invention, the inverted n-type layer formed at the re-growth interface just above the active layer is re-inverted to p-type by doping high-concentration Zn, whereby holes can be effectively injected into the active layer and the excellent oscillation characteristic can be achieved. Accordingly, the leak current which is injected into the p block layer and thus the withstand voltage of the block layer is lowered in the conventional structure can be reduced, so that an excellent and high output characteristic can be expected to be achieved. Further, the laser structure of the present invention has also such an effect that it is applicable to not only single devices such as a Fabry-Perot type semiconductor laser, a semiconductor laser amplifier, a distribution feedback type semiconductor laser, but also other various devices such as a modulator integrated light source, a distribution Bragg reflection type semiconductor laser.

What is claimed is:

1. A semiconductor laser comprising an active layer provided between two different conduction types of semiconductor layers and current block layers surrounding said active layer;

wherein one of said semiconductor layers has a first growth layer and a second growth layer which is formed on said first growth layer by a re-growth process after a growth process for said first growth layer, and a doping concentration of said second growth layer in the range of at least 0.1 μm in thickness from the interface between said first growth layer and said second growth layer is from 1.5 times to 5 times of a doping concentration of an area other than the area within said range in said second growth layer.

2. The semiconductor laser as claimed in claim 1, wherein a current narrowing structure having a pnpn thyristor is provided at both the sides of said active layer, and the current injected is efficiently concentrated on said active layer.

3. The semiconductor laser as claimed in claim 1, wherein said active layer is designed in a quantum well or multiple quantum well structure.

4. The semiconductor laser as claimed in claim 1, wherein the side wall of an optical waveguide collectively formed with semiconductor laser portion by a selective growth is (111) crystal plane.

5. The semiconductor laser as claimed in claim 1, wherein the operating wavelength is set to 0.3 to 1.7 μm.

6. The semiconductor laser as claimed in claim 1, wherein an optical waveguide is provided and said optical waveguide is designed in a buried type.

7. The semiconductor laser as claimed in claim 1, wherein the semiconductor laser is a distribution feedback type semiconductor laser or a distribution reflection type semiconductor laser, and at least one of a taper waveguide, an optical modulator, a photodetector, an optical switch and an optical waveguide is integrally formed with the semiconductor laser.

8. The semiconductor laser as claimed in claim 1, wherein a first separated confinement heterostructure layer is provided between said active layer and one semiconductor layer of said two different conduction types of semiconductor layers, and a second separated confinement heterostructure layer is provided between said active layer and the another semiconductor layer of said two different conduction types of semiconductor layers.

9. An optical module formed by using at least one semiconductor laser of claim 1.

10. An optical communication system formed by using at least one semiconductor laser of claim 1.

* * * * *